United States Patent
Meyer-Berg

(10) Patent No.: US 7,414,311 B2
(45) Date of Patent: Aug. 19, 2008

(54) BALL GRID ARRAY HOUSING HAVING A COOLING FOIL

(75) Inventor: Georg Meyer-Berg, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/761,886

(22) Filed: Jun. 12, 2007

(65) Prior Publication Data

US 2007/0228565 A1 Oct. 4, 2007

Related U.S. Application Data

(62) Division of application No. 11/143,123, filed on Jun. 2, 2005, now Pat. No. 7,256,493.

(30) Foreign Application Priority Data

Jun. 2, 2004 (DE) .................. 10 2004 027 074

(51) Int. Cl.
*H01L 23/26* (2006.01)
(52) U.S. Cl. ............... 257/713; 257/E23.103; 257/707; 257/E23.13; 438/122
(58) Field of Classification Search .......... 257/712, 257/625
See application file for complete search history.

(56) References Cited

U.S. PATENT DOCUMENTS

| 5,654,116 | A | 8/1997 | Kato et al. |
| 5,736,785 | A | 4/1998 | Chiang et al. |
| 5,969,426 | A | 10/1999 | Baba et al. |
| 6,411,507 | B1 | 6/2002 | Akram |
| 6,507,116 | B1* | 1/2003 | Caletka et al. ............... 257/778 |
| 6,627,997 | B1 | 9/2003 | Eguchi et al. |
| 6,853,069 | B2 | 2/2005 | Akram et al. |
| 7,256,493 | B2 | 8/2007 | Meyer-Berg |
| 2001/0015493 | A1 | 8/2001 | Hembree |
| 2002/0060369 | A1* | 5/2002 | Akram ........................ 257/782 |
| 2002/0190397 | A1* | 12/2002 | Kim ............................ 257/796 |
| 2003/0024648 | A1 | 2/2003 | Carlson et al. |
| 2003/0141583 | A1* | 7/2003 | Yang .......................... 257/686 |

FOREIGN PATENT DOCUMENTS

DE 10129388 1/2003

OTHER PUBLICATIONS

Lee, An Investigation of Thermal Enhancement on Flip Chip Plastic BGA Packages Using CFD Tool, IEEE Transactions on Components and Packaging Technologies, vol. 23, No. 3, September 200, pp. 481-489.

* cited by examiner

Primary Examiner—Leonardo Andujar
Assistant Examiner—Krista Soderholm
(74) Attorney, Agent, or Firm—Dicke, Billig, Czaja PLLC

(57) ABSTRACT

A ball grid array housing, a semiconductor device having a ball grid array housing and an electronic circuit are disclosed. In one embodiment, a ball grid array housing includes a substrate with solder ball connections pointing out from a housing and at least one semiconductor chip. For better heat dissipation from the housing, the ball grid includes a metallic cooling foil, or a metallic cooling plate. A method of making a ball grid array is also disclosed.

16 Claims, 3 Drawing Sheets

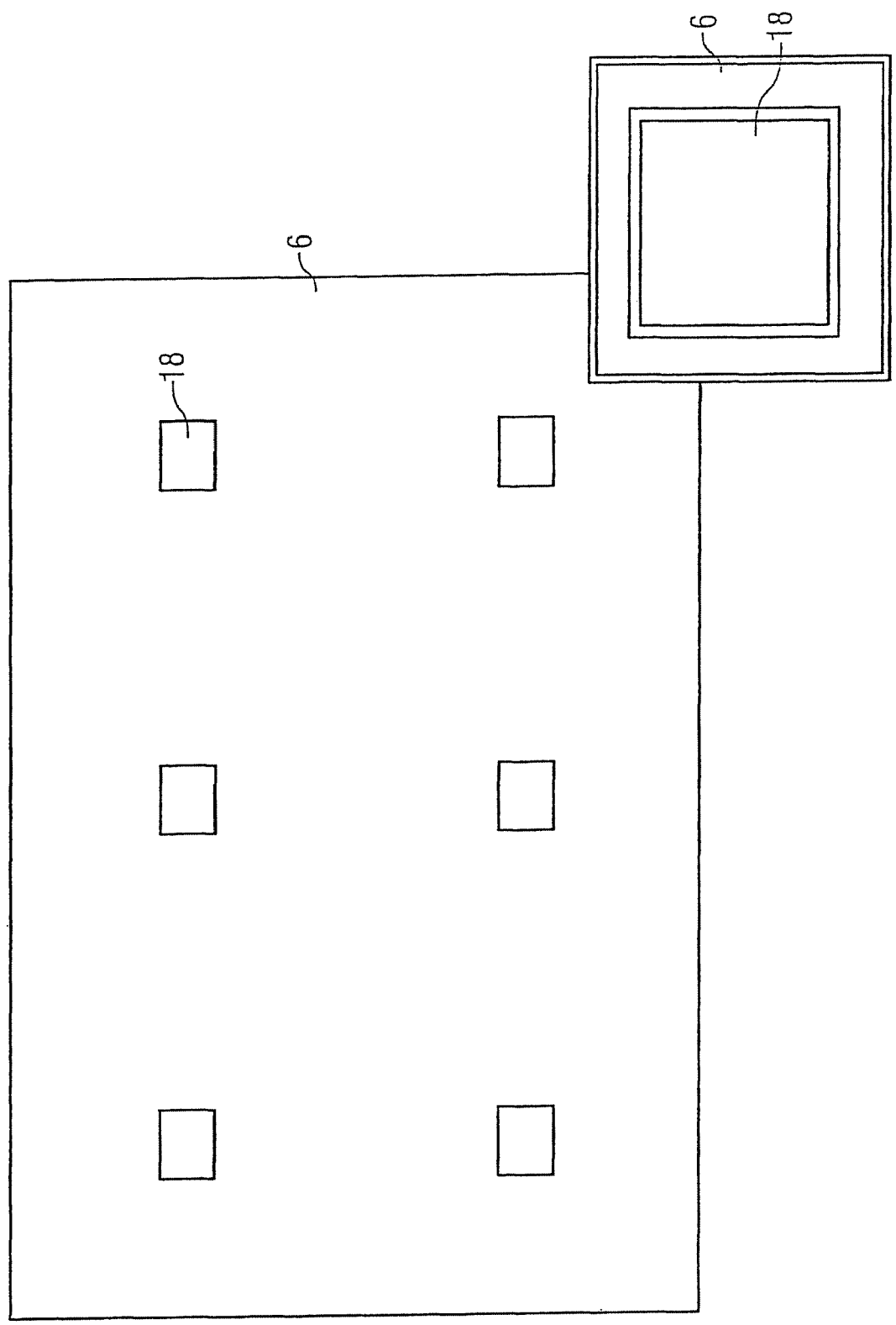

BALL GRID ARRAY HOUSING HAVING A COOLING FOIL

CROSS-REFERENCE TO RELATED APPLICATIONS

This application is a Divisional of U.S. patent application Ser. No. 11/143,123, filed Jun. 2, 2005, which claims priority to German Patent Application No. DE 10 2004 027 074.0, filed on Jun. 2, 2004, both of which are incorporated herein by reference.

FIELD OF THE INVENTION

The invention relates to a ball grid array (BGA) housing having a metallic cooling foil, and in particular a BGA housing having a metallic cooling foil which contains a flip chip.

SUMMARY

The present invention provides a ball grid array housing and a semiconductor device having a ball grid array device. In one embodiment, the present invention includes a ball grid array housing including a substrate with solder ball connections, pointing out from a housing. At least one semiconductor chip is applied on the substrate and electrically conductively connected thereto. A metallic cooling foil is applied on a side of the semiconductor chip which faces away from the substrate, and which covers at least partial regions of the semiconductor chip, the cooling foil being in thermally conductive contact with the partial regions of the semiconductor.

BACKGROUND

BGA housings have been known for a relatively long time and are used in the semiconductor industry whenever high connection densities are to be realized on a small space for ICs (integrated circuits).

A typical BGA housing has a housing made of a plastic molding composition on the top side and a carrier or a substrate with solder ball connections on the underside. In the case of a plastic BGA housing (PBGA) the substrate is composed of a plastic material, and the substrate comprises ceramic in the case of a ceramic BGA housing (CBGA). Depending on the BGA type, the solder ball connections are arranged over the whole area or in a plurality of rows. In the interior, the BGA housing has, for example, a conventionally contact-connected IC, a flip-chip or a plurality of semiconductor chips in a stacked design or one beside the other.

Conventional BGA housings have the disadvantage that the heat arising in the semiconductor chip during operation of the semiconductor device can be transported away only poorly. For the purpose of transporting away heat from the semiconductor chip, a conventional BGA housing only affords the option of dissipating the heat into the substrate with the solder ball connections, since the plastic molding composition surrounding the semiconductor chip and the contact-connections typically represents a good thermal insulator.

For those and other reasons, there is a need for the present invention.

In order to improve the dissipation of heat, therefore, substrates are used whose basic body has thermally conductive reinforced copper layers besides the plastic material.

The use of these substrates constructed in layered fashion has the disadvantage that—besides the high costs for a substrate of this type—the dissipation of heat from the semiconductor chip is limited by the thermal conductivity of the joint between the semiconductor chip and the substrate. In the case of BGA housings having a flip-chip in their interior, this thermal conductivity is problematic on account of the dimensioning of the flip-chip contacts.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 illustrates a schematic construction of one embodiment of a cooling foil in accordance with the present invention.

DETAILED DESCRIPTION

Figure 1:
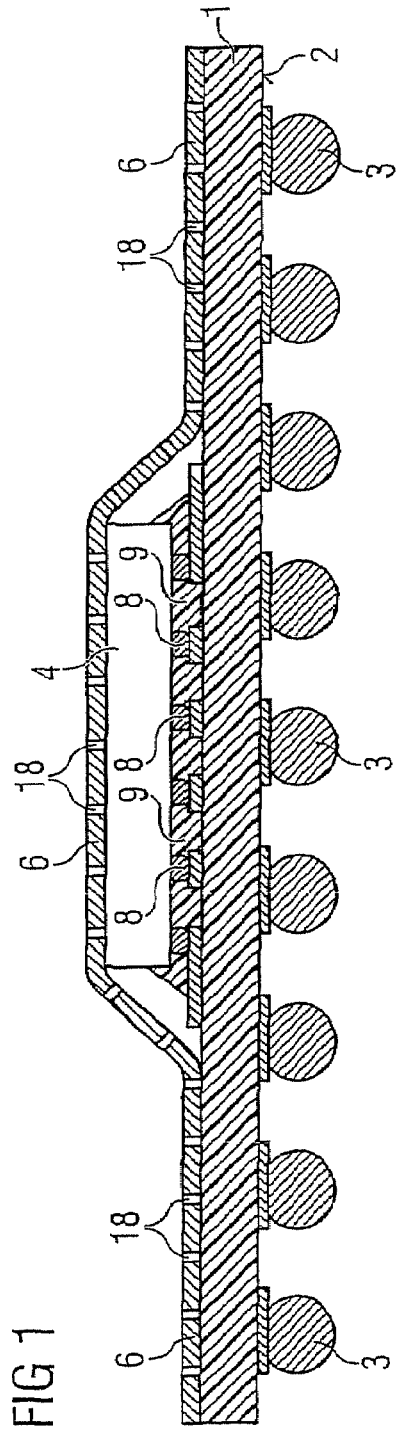
FIG. 1 illustrates a schematic construction of one embodiment of a BGA housing with a flip-chip in accordance with the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a BGA housing which enables a good dissipation of heat from an integrated semiconductor chip.

In one embodiment, a BGA device in accordance with the present invention includes a substrate with solder ball connections on which at least one semiconductor chip is fixed.

The semiconductor chip is electrically conductively connected to the substrate either in a conventional manner, that is to say by means of wire contacts, or by means of flip-chip contacts.

In one embodiment, a BGA housing in accordance with the present invention includes a substrate, on which at least one semiconductor chip is applied on one side. Solder ball connections projecting from the housing are situated on the other side of the substrate. The BGA housing according to the invention furthermore contains a metallic cooling foil which, in accordance with the present invention, is directly thermally conductively connected at least to partial regions of the surface of the semiconductor chips applied on the substrate. The semiconductor chips applied on the substrate are additionally surrounded by a plastic molding composition, which is applied on that side of the substrate which has the semiconductor chip or semiconductor chips in such a way that at least partial regions of the cooling foil are not covered by the plastic molding composition and heat is thus able to be transported away well from the BGA housing according to the invention by means of the uncovered cooling foil.

In order to obtain the best possible thermal conductivity between the semiconductor chip contained in the BGA housing and the cooling foil, the cooling foil is preferably fixed by means of a thermally conductive adhesive layer on the semiconductor chip surface. Other types of connection between the semiconductor chip surface and cooling foil are likewise possible. Thus, by way of example, it is possible to produce an intimate contact between cooling foil and semiconductor chip surface by simply pressing on the cooling foil if this is permitted by the semiconductor chip geometry and the surface.

In order to enable an optimum heat dissipation from the BGA housing, the material for the cooling foil should be chosen accordingly. In particular, aluminum, copper, silver and alloys of these metals and also other, as soft as possible, thermally conductive metals or alloys are suitable for producing a cooling foil in accordance with the present invention.

In order to achieve a sufficient thermal conductivity, the cooling foil according to the invention should have a thickness of at least 40 micrometers.

In a further embodiment of the present invention, the cooling foil has a thickness of at least 0.1 millimeter, so that it may also be designated as a "cooling plate". The use of a cooling plate in the sense of the present invention has the advantage that, besides transporting away heat, the cooling plate additionally provides a degree of mechanical protection for the semiconductor chip situated below the cooling plate, so that an encapsulation of the semiconductor chip can be dispensed with to the greatest possible extent.

In an advantageous embodiment of the present invention, the semiconductor chip, in the BGA housing according to the invention, is connected to the substrate by flip-chip contact-connections. This has the advantage that that side of the semiconductor chip which faces away from the substrate and is thus free has no active or sensitive structures whatsoever, so that, after the cooling foil according to the invention has been applied on the free semiconductor chip side, it is then possible, in particular, to dispense with a protection of the semiconductor chip against mechanical damage by virtue of an additional plastic molding composition encapsulation if the cooling foil has a corresponding thickness.

A BGA housing in accordance with the present invention is also suitable for mounting semiconductor chips which are connected to the substrate by wire contact-connections. In this case, the plastic molding composition is shaped such that the plastic molding composition also encloses the wire contact-connections and adjacent regions of the semiconductor chip in order to avoid mechanical damage to the very sensitive wire contact-connections. In this embodiment, the cooling foil according to the invention is directly connected only to the remaining free region on the semiconductor chip surface.

In a further embodiment of the present invention, instead of one semiconductor chip, at least one further semiconductor chip is arranged in the BGA housing. If compact housing forms are to be obtained, it is advantageous to arrange the semiconductor chips one above the other in a stacked design. The cooling foil is then applied to the topmost semiconductor chip. If the housing form is to be as flat as possible, the semiconductor chips may also be arranged one beside the other. The cooling foil is then preferably applied in such a way that it is directly connected to all the semiconductor chips. Through the choice of a foil with a suitable thickness, it is possible moreover, to compensate for any height differences between the various semiconductor chips by virtue of mechanical deformation of the cooling foil during mounting, for example through the use of an elastically deformable press-on stamp.

In order to produce a BGA housing having a cooling foil in accordance with the present invention, the procedure is as follows. In a first step, the semiconductor chip is connected to the substrate either using flip-chip technology or in a conventional manner. If the semiconductor chip is applied to the substrate using flip-chip technology, then in a next step the plastic molding composition is preferably applied to the substrate in such a way that that side of the semiconductor chip which faces away from the substrate remains free of the molding composition. If the semiconductor chip is connected to the substrate via wire contact-connections, the wire contact-connections are also enclosed by the plastic molding composition. The cooling foil is subsequently applied. This may be done directly or using adhesives. If a thin cooling foil is used, it is advantageous to apply it by using an elastically deformable pressing or roller tool since a high throughput can be achieved in this way and, on account of the deformability of the tool, a precise alignment thereof is unnecessary. Instead of the cooling foil, a cooling plate may also be used in accordance with the present invention. Depending on the housing geometry it may be advantageous in this case to use an already bent cooling plate which is connected to the housing, for example, using a thermally conductive adhesive. Both cooling foil and cooling plate may be configured in such a way that either the entire side of the semiconductor chip which faces away from the substrate or only partial regions thereof are in direct contact with the cooling foil or with the cooling plate. Furthermore, it is possible for the cooling foil or the cooling plate also to cover at least partial regions of the substrate. In this case, the shapings of cooling foil or cooling plate and plastic molding composition may be coordinated with one another in such a way that it is possible to achieve an optimum dissipation of heat from the BGA housing with optimum mechanical protection of the semiconductor chip.

A semiconductor device having a BGA housing in accordance with the present invention is employed in particular in electronic circuits in which increased temperatures are to be expected in the BGA housing during operation.

The BGA housing according to the invention is described below on the basis of various exemplary embodiments in accordance with the drawing. Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

FIG. 1 illustrates a schematic construction of one embodiment of a BGA housing with a flip-chip in accordance with the present invention. A substrate 1 has solder ball connections 3 on an underside 2. A semiconductor chip 4 is applied on the substrate 1 on the other side. In the embodiment illustrated in FIG. 1, the semiconductor chip 4 is connected to the substrate 1 using flip-chip technology. Flip-chip contact-connections 8 and filling material or underfill 9 are illustrated. In the embodiment illustrated, a cooling foil 6 is connected to the BGA device in such a way that both that side of the semiconductor chip 4 which faces away from the substrate 1 and partial regions on the substrate 1 are completely covered with the cooling foil 6. In the embodiment illustrated here, the cooling foil 6 additionally has openings 18 distributed uniformly on the entire cooling foil 6 in order to prevent the popcorn effect from occurring. The exemplary embodiment illustrated in FIG. 1 does not have an encapsulation with a molding composition. In order to produce the radiation characteristic of a black body, the uncovered cooling foil 6 can be blackened, which may be effected, particularly when using silver or silver alloys, by means of a surface sulfiding.

Figure 2:
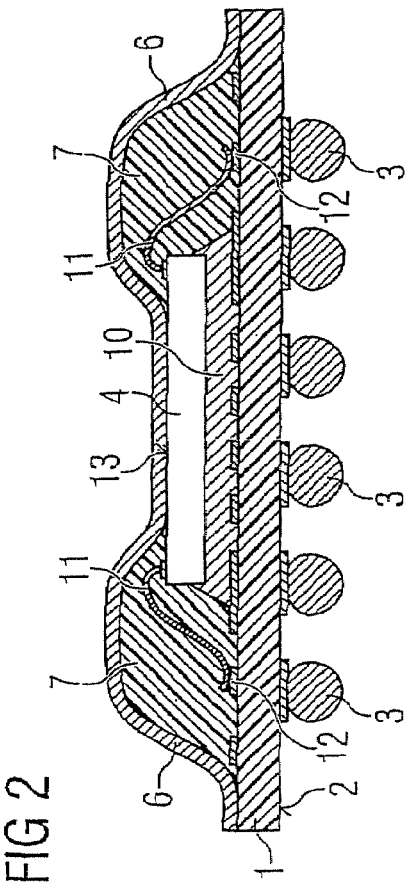
FIG. 2 illustrates a schematic construction of one embodiment of a BGA housing with a conventionally contact-connected semiconductor chip in accordance with the present invention.

FIG. 2 illustrates the schematic construction of a BGA housing with a conventionally contact-connected semiconductor chip in accordance with the present invention. In accordance with FIG. 2, a semiconductor chip 4 is applied and contact-connected in a conventional manner on a substrate 1, which again has solder ball connections 3 on its rear side 2. The semiconductor chip 4 is applied on the substrate 1 via a contact-connection layer 10. For electrical contact-connection, wire contact-connections 11 are led from the semiconductor chip 4 to corresponding pads 12 on the substrate 1. In the embodiment illustrated in FIG. 2, the molding composition 7 covers not only large regions of the substrate 1 but also the wire contact-connections 11 and regions on the top side 13 of the semiconductor chip 4 that are arranged in the vicinity of the wire contact-connections 11. The molding composition 7 and the uncovered region of the side 13 of the semiconductor chip 4 are covered by a cooling foil 6, which has no openings in the embodiment illustrated in FIG. 2.

Figure 3:
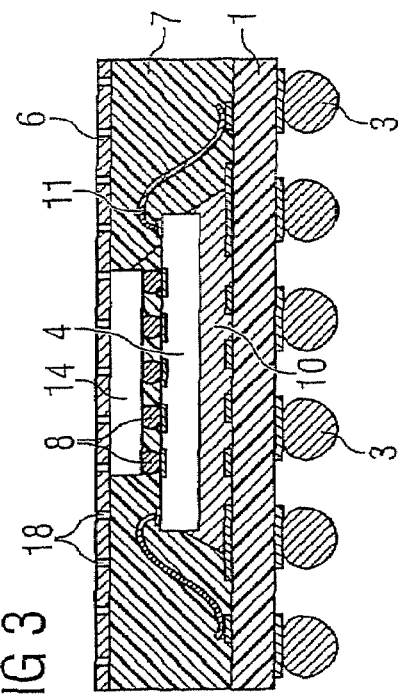
FIG. 3 illustrates a schematic construction of one embodiment of a BGA housing with two semiconductor chips in a stacked design.

FIG. 3 illustrates the schematic construction of a BGA housing with two semiconductor chips in a stacked design. A first semiconductor chip 4 is fixed and contact-connected on a substrate 1 in a conventional manner. A second semiconductor chip 14 is applied on the first semiconductor chip 4 by means of flip-chip technology. The molding composition 7 surrounds both the first semiconductor chip 4 with its wire contact-connections 11 and the second semiconductor chip 14, but the top side of the semiconductor chip 14 is left free. In the embodiment illustrated in FIG. 3, a cooling foil 6 having openings 18 is applied to the left-free top side of the semiconductor chip 14 and to the top side of the molding composition 7.

Figure 4:
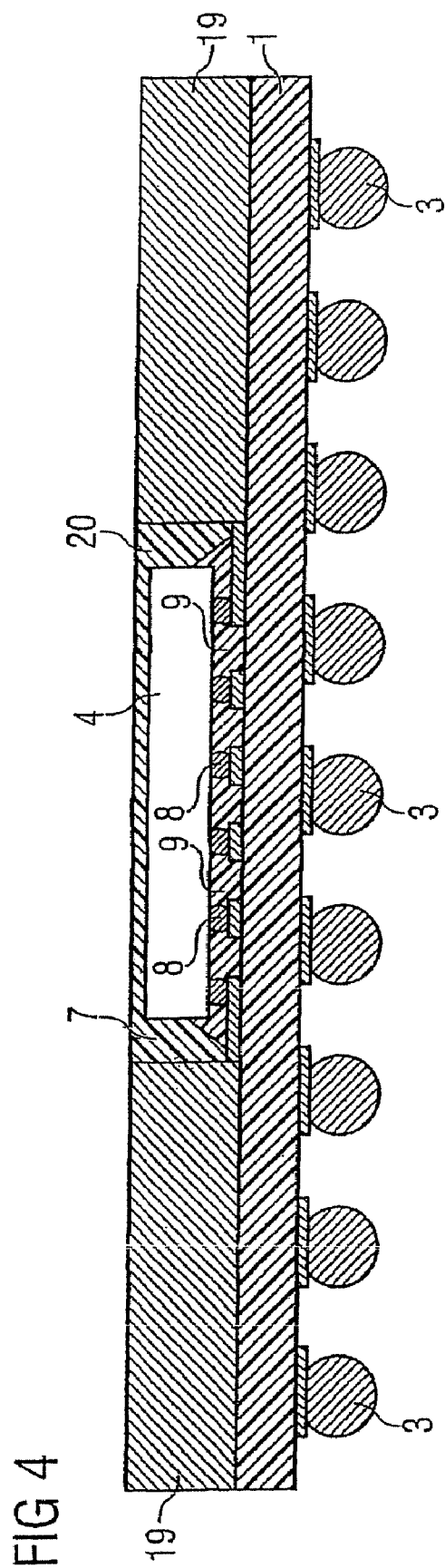
FIG. 4 illustrates a third embodiment in accordance with the present invention.

FIG. 4 illustrates a third embodiment in accordance with the present invention. A semiconductor chip 4 is applied and contact-connected on the substrate 1 using flip-chip technology. As in FIG. 3, the BGA housing from FIG. 4 likewise has a cooling plate 19 which, however, in contrast to the embodiment illustrated in FIG. 3, is arranged in framelike fashion around the semiconductor chip 4 on the substrate 1. In the embodiment illustrated here, the molding composition 7 fills the space between the semiconductor chip 4 and the cooling plate 19 and completely covers the semiconductor chip 4.

Both the cooling foil 6 and the cooling plate 19 from the embodiments illustrated in FIGS. 1 to 4 serve for improved dissipation of heat from the underlying semiconductor chip 4 and 14, respectively, as illustrated in FIGS. 1 to 3; the cooling foil 6 or a cooling plate additionally serves for mechanical protection of that side of the semiconductor chip 4 and 14, respectively, which is not covered by the molding composition 7.

FIG. 5 illustrates the schematic construction of a cooling foil in accordance with the present invention, as illustrated in FIG. 1 and FIG. 3. The cooling foil 6 has openings 18 which are arranged at regular distances and enable access to the underlying semiconductor chip 4 and 14, respectively, via correspondingly arranged contact pads (not illustrated). The arrangement of the openings 18, may be in the region of the contact pads, which has the advantage that the same cooling foil can be used for different semiconductor chips, or the arrangement of the openings 18 is coordinated precisely with the underlying semiconductor chip.

In order to produce a BGA semiconductor device in accordance with the present invention corresponding to the embodiments illustrated in FIGS. 1 and 2, the procedure is as follows. A semiconductor chip 4 is applied to a substrate 1 and contact-connected either using flip-chip technology or in a conventional manner. Afterward, said semiconductor chip may be surrounded by a molding composition 7, as can be seen from FIG. 2. The wire contact-connections 11 are likewise embedded in the molding composition 7 together with adjacent regions on the top side 13 of the semiconductor chip 4. A cooling foil 6 is then applied, for example using a thermally conductive adhesive, on that region of the semiconductor chip 4 which is not covered by the molding composition and on at least partial regions of the molding composition 7 and on at least partial regions of the substrate 1.

In order to produce a BGA semiconductor device in accordance with the embodiment shown in FIG. 3, firstly the two semiconductor chips 4 and 14 are arranged in a stacked design on the substrate 1, and are subsequently embedded in the molding composition 7. The cooling foil 6 is then applied, as described above.

In order to produce a BGA semiconductor device in accordance with the embodiment shown in FIG. 4, after the application and contact-connection of the semiconductor chip 4, a cooling plate 19 formed in framelike fashion is applied on the substrate 1. Afterward, the interspace remaining between the cooling plate 19 and the semiconductor chip 4 is surrounded with a thermally conductive paste 20 in order that the semiconductor chip 4 is optimally thermally coupled to the cooling plate 19.

What is claimed is:

1. A ball grid array housing comprising:
   a substrate with solder ball connections, pointing out from a housing;
   at least one semiconductor chip, which is applied on the substrate and electrically conductively connected thereto via one or more wire contact connections extending between the substrate and the at least one semiconductor chip;
   a molding composition applied to the substrate and at least partially surrounding the at least one semiconductor chip, wherein the one or more wire contact connections are at least partially embedded in the molding composition; and
   a metallic cooling foil applied on a side of the semiconductor chip which faces away from the substrate, the metallic cooling foil covering at least partial regions of the semiconductor chip and at least partial regions of the molding composition, the cooling foil being in thermally conductive contact with the at least partial regions of the semiconductor chip and with the at least partial regions of the molding composition;
   the cooling foil having openings therethrough that are free of the molding composition.

2. The ball grid array housing of claim 1, wherein the cooling foil is in direct contact with the substrate.

3. The ball grid array housing of claim 1, wherein the cooling foil comprises at least one material of a group consisting of aluminum, copper, silver or soft alloys.

4. The ball grid array housing of claim 1, wherein the cooling foil comprises a thickness of at least 40 μm.

5. The ball grid array housing of claim 1, wherein the semiconductor chip is connected to the substrate by wire contact-connections.

6. The ball grid array housing of claim 1, wherein a second semiconductor chip is arranged in a stacked design on the semiconductor chip.

7. The ball grid array housing of claim 1, wherein a second semiconductor chip is arranged beside the semiconductor chip on the substrate.

8. The ball grid array housing of claim 1, wherein the one or more wire contact-connections are each coupled with a surface of the substrate opposite the solder ball connections.

9. The ball grid array housing of claim 1, further comprising:
a contact-connection layer separate from the molding composition extending between the substrate and the at least one semiconductor chip.

10. A semiconductor device comprising:
a ball grid array housing comprising a substrate with solder ball connections, pointing out from a housing, at least one semiconductor chip, applied on the substrate and electrically conductively connected thereto via at least one wire contact connection, a molding composition applied to the substrate and at least partially surrounding the at least one semiconductor chip, wherein the at least one wire contact connection is at least partially embedded in the molding composition, and a metallic cooling foil which is applied on that side of the semiconductor chip which faces away from the substrate, and which covers at least partial regions of the semiconductor chip, the cooling foil being in thermally conductive contact with the partial regions of the semiconductor; the cooling foil having openings therethrough that are free of the molding composition.

11. An electronic circuit comprising:
a semiconductor device including a ball grid array housing comprising a substrate with solder ball connections, pointing out from a housing; at least one semiconductor chip, applied on the substrate and electrically conductively connected thereto via a wire contact connection, a molding composition applied to the substrate and at least partially surrounding the at least one semiconductor chip, wherein the at least one wire contact connection is at least partially embedded in the molding composition; and a metallic cooling foil which is applied on that side of the semiconductor chip which faces away from the substrate, and which covers at least partial regions of the semiconductor chip, the cooling foil being in thermally conductive contact with the partial regions of the semiconductor; the cooling foil having openings therethrough that are free of the molding composition.

12. A ball grid array housing comprising:
a substrate with solder ball connections, pointing out from a housing;
at least one semiconductor chip, which is applied on the substrate and electrically conductively connected thereto via one or more wire contact connections extending between the substrate and the at least one semiconductor chip; and
a molding composition applied to the substrate and at least partially surrounding the at least one semiconductor chip, wherein the one or more wire contact connections are at least partially embedded in the molding composition; and
a cooling foil applied on a side of the semiconductor chip which faces away from the substrate, and which covers at least partial regions of the semiconductor chip, the cooling foil being in thermally conductive contact with the partial regions of the semiconductor, and wherein the cooling foil is applied on the side of the semiconductor chip which faces away from the substrate additionally covering at least partial regions of a molding composition, and the cooling foil is in thermally conductive contact with the partial regions of the semiconductor chip and with the partial regions of the molding composition; and
wherein the cooling foil has openings therethrough that are free of the molding composition.

13. The ball grid array housing of claim 12, wherein the cooling foil is in direct contact with the substrate.

14. The ball grid array housing of claim 13, wherein the cooling foil comprises at least one material of a group comprising aluminum, copper, silver or soft alloys.

15. The ball grid array housing of claim 14, wherein the cooling foil comprises a thickness of at least 40 μm.

16. The ball grid array housing of claim 12, wherein a second semiconductor chip is arranged in the ball grid array housing.

* * * * *